United States Patent [19]
Kunkel

[11] Patent Number: 5,142,134
[45] Date of Patent: Aug. 25, 1992

[54] METHOD FOR OPERATING A CIRCUIT ARRANGEMENT

[75] Inventor: Horst K. Kunkel, Stuttgart, Fed. Rep. of Germany

[73] Assignee: Hansa Metallwerke AG, Stuttgart, Fed. Rep. of Germany

[21] Appl. No.: 714,595

[22] Filed: Jun. 13, 1991

[30] Foreign Application Priority Data

Jun. 22, 1990 [DE] Fed. Rep. of Germany ....... 4019927

[51] Int. Cl.$^5$ .............................................. G01J 1/32
[52] U.S. Cl. .................. 250/205; 250/214 B; 250/221
[58] Field of Search ............... 250/205, 214 B, 221, 250/222.1

[56] References Cited

U.S. PATENT DOCUMENTS 4,207,466  6/1980  Drage et al. ................. 250/221
4,915,347  4/1990  Iqbal et al. .................. 250/221

Primary Examiner—Craig E. Church
Attorney, Agent, or Firm—Fred Philpitt

[57] ABSTRACT

A circuit arrangement for a sanitary fitting controlled in a non-contacting manner comprises a transmitter (3) as well as a receiver (4), at which radiation emitted by the transmitter (3) arrives after reflection on an object (7). In an initialization process, which takes place for the first time after the initial installation, thereafter at greater regular time intervals, the capacity of the transmitter (3) is increased until the reflection on a stationary object (7) in the monitoring range has the result that the evaluation circuit (5) following the receiver (4) is activated. Now the capacity of the transmitter (3) is once more reduced somewhat; the circuit arrangement changes to normal operation. It now has its optimum sensitivity, at which stationary objects (7) no longer cause faulty actuations, but the greatest possible monitoring range is provided for movable objects to be monitored.

9 Claims, 1 Drawing Sheet

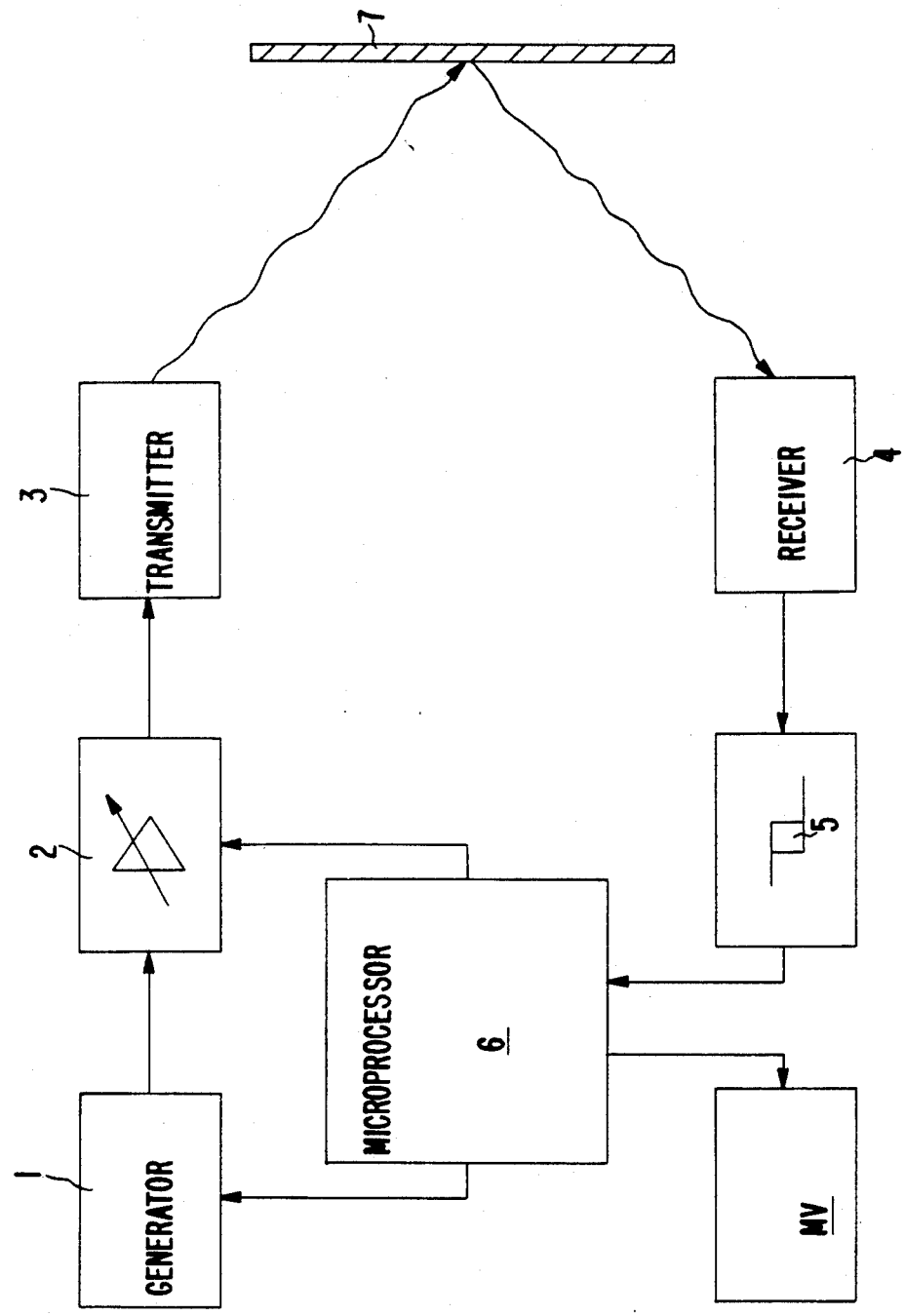

METHOD FOR OPERATING A CIRCUIT ARRANGEMENT

The invention relates to a method for operating a circuit arrangement for a sanitary fitting controlled in a non-contacting manner with a transmitter, with a receiver, onto which radiation emitted by the transmitter can be reflected back by an object, and with an evaluation circuit following the receiver, which evaluation circuit emits an output signal when the signal emitted by the receiver exceeds a predetermined threshold value.

In circuit arrangements of this type, the problem always exists that it is always necessary to differentiate between the reflection of the radiation emitted by the transmitter on stationary objects, for example on washhand basins, and the reflection on the user or parts of the user's body. The reflection on the stationary objects should not lead to the actuation of the sanitary fitting, thus to the flow of water, since then the flow of water would no longer be terminated. If one reduces the sensitivity of the circuit arrangement to such an extent that stationary objects certainly do not lead to actuation even in the course of time, in which both the surface nature of the stationary objects as well as the electrical components of the circuit arrangement may vary, then relatively great dead areas must be preserved. In the latter, the circuit arrangement no longer responds even to the user.

In a known circuit arrangement of the aforementioned type, which is described in DE-PS 34 08 261, this problem is tackled as follows: means for forming a long-term average value are provided, which form a long-term average value of the reception signal over relatively long time intervals. This long-term signal is then representative of that radiation which is reflected by the stationary objects. The instantaneous value of the reception signal is now compared with the long-term signal; only when there is a certain minimum deviation in comparison therewith, is the known circuit arrangement actuated. With these measures it is possible to achieve both a "self-balancing" of the circuit arrangement to a certain environment as well as a re-adjustment with respect to continuous variations of the environment and with respect to internal aging processes. However, it is a drawback that current must be supplied continuously to the circuit arrangement, in order to form the long-term average value. This involves a power consumption, which at any rate is no longer tolerable if the circuit arrangement is to be supplied with power by a battery.

It is the object of the present invention to propose a method and a circuit arrangement of the aforementioned type, in which an automatic adaptation to the respective local factors is achieved whilst attaining maximum sensitivity with a simultaneously low power requirement.

This object is achieved according to the invention in the aforementioned method due to the fact that at the time of the initial installation of the circuit arrangement, an initialisation operation is automatically started and carried out, in the course of which the capacity of the transmitter is increased progressively, until the evaluation circuit responds due to radiation reflected on a stationary object, that then the capacity of the transmitter is once again reduced somewhat and then, at this reduced capacity of the transmitter, there is a return to normal operation.

Thus, according to the invention, with the "initialisation operation" a special mode of operation of the circuit arrangement is created, which precedes the actual normal operation: the surroundings of the circuit arrangement are so to speak "scanned"; the circuit arrangement automatically tests out that transmitter capacity at which the respective stationary objects lead to an actuation of the evaluation circuit following the receiver. This is the transmitter capacity which should no longer be reached during operation. For this reason, the circuit arrangement automatically returns to a somewhat lower transmitter capacity. Only then is there a return to normal operation of the circuit arrangement. As the name suggests, normal operation takes place exactly as in the prior art: if a user approaches the sanitary fitting, then part of the radiation emitted by the transmitter is reflected back on him to the receiver. This leads to an output signal of the evaluation circuit following the receiver, if the signal emitted by the receiver exceeds a certain threshold value. The sensitivity of the arrangement achieved according to the invention largely avoids dead spaces, in which a response to objects would be desirable per se, but must be avoided for safety reasons.

The measures by which the invention prevents a faulty initiation by stationary objects, do not take place continuously during the entire operation of the circuit arrangement, but, as described, precede the normal operation. The normal operation may therefore take place with all the known energy-saving measures, thus in particular with a cyclic transmitter.

The value of the capacity of the transmitter ascertained at the time of this initialisation process should be compared with a predetermined tolerance range, within which the capacity must be located at the time of normal operation of the circuit arrangement. If, during the initialisation process, no transmitter capacity is reached, which lies within the tolerance range, then if necessary the initialisation process is repeated several times. If, after a certain number of repetitions, an admissible transmitter capacity is still not achieved, this means that there is a fault in the circuit arrangement or the associated mechanical components. A fault signal can then be emitted.

According to a further feature of the invention, it is provided that the initialisation process is repeated automatically within greater time intervals after the initial installation. Due to this repetition within greater time intervals, for example every fourteen days, there occurs a self-adaptation of the circuit arrangement to continuously changing processes, for example to a colour change of the stationary objects, which accompany a variation of the reflection capacity, to aging of the electronic components of the circuit arrangement itself, or to dirtying of the optical windows or the like.

A circuit arrangement according to the invention of the aforementioned type is characterised by the fact that
 d) the transmitter is supplied with power by an amplifier having variable amplification, which comprises one input for applying a variable control voltage;
 e) a programmable device is provided, which in turn comprises:
  an input (a), to which the output signal of the evaluation circuit can be supplied;
  an output (d), which is connected to the input (b) of the amplifier (2),
  the programmable device being programmed so that in an initialisation process, after the initial installation, a signal sent to it at the input (b) of the amplifier is varied progressively so long in the direction in which an increase of the amplification results, until the evaluation circuit is actuated by radiation reflected on a stationary object, that then the signal of the programmable device sent to the amplifier is reduced slightly in the sense of reducing the amplification, and that then there is an automatic change to normal operation of the circuit arrangement at this reduced amplification.

The purpose of these measures proposed according to the invention is accordingly apparent from the explanations given above in relation to the method according to the invention.

Advantageous embodiments of the circuit arrangement according to the invention are described in claims 5 to 9.

One embodiment of the invention will be described in detail hereafter with reference to the drawing;

the single Figure shows diagrammatically the block circuit diagram of a circuit arrangement for a sanitary fitting controlled in a non-contacting manner.

In the drawing, the reference numeral 1 designates a generator, which produces an output signal with a predetermined basic frequency, for example of 50 kHz. This output signal is supplied to the input (a) of an amplifier 2, whereof the amplification factor can be controlled by way of a further input signal, which is applied at the input (b). The output signal of the amplifier 2 is applied to the transmitter 3, which emits detection radiation at the frequency predetermined by the generator 1. In the present connection the type of radiation is of subordinate significance: for the purposes of the description, it is assumed that it is infra-red radiation. In this case, a transmitting diode is located within the transmitter 3.

The radiation emitted by the transmitter 3 is reflected back to a receiver 4 by an object 7, which may be a user, but also a stationary object, for example a wash-hand basin. When using infra-red light, the receiver 4 contains a receiving diode. The output signal of the receiver 4 is supplied to a pulse-shaper 5, which contains a narrow-band amplifier tuned to the frequency of the generator 1 and a Schmitt trigger. As soon as the input signal at the pulse-shaper 5, in so far that it lies within the frequency band in question, exceeds a certain threshold value, the output potential of the pulse-shaper 5 changes from one value to another.

The output of the pulse-shaper 5 is connected to one input a of a microprocessor 6. The latter also has the output b, c and d.

Connected to the output b of the microprocessor 6 is the driver circuit for the solenoid valve MV, which controls the flow of water of the sanitary fitting. The output c is connected to the generator 1. Finally, the output d is connected to the control input b of the controllable amplifier 2.

The method of operation of the circuit arrangement described is as follows:

If the sanitary fitting controlled in a non-contacting manner with the circuit arrangement illustrated in the drawing is installed for the first time in situ, then for example after switching-on the operating voltage, first of all an initialisation process takes place within the circuit arrangement, which serves for adjusting the correct sensitivity. This initialisation is intended to ensure that the sanitary fitting is not activated by stationary objects, for example the wash-hand basin, at which the sanitary fitting is installed. Controlled by suitable programming of the microprocessor 6, the initialisation takes place as follows:

By way of its output c, the microprocessor 6 sends pulses of predetermined width, at predetermined time intervals, to the generator 1. During the duration of these pulses, the generator 1 produces its output signal with the above-mentioned pulse frequency. The microprocessor 6 first of all makes a signal with a relatively low level available at the output d, which adjusts the amplification factor of the amplifier 2 to a relatively low value. The output of the transmitter 3 is correspondingly low. The intensity of the radiation, which is reflected by a stationary object 7 onto the receiver 4, is therefore first of all not sufficient to actuate the pulse-shaper 5, so that no variation of the potential takes place at the input a of the microprocessor 6.

At short time intervals, the microprocessor 6 now varies the value of the level, which the signal emitted at its output d has. In a corresponding manner, the amplification factor of the amplifier 2 and thus the capacity of the transmitter 3 is progressively increased, until finally the radiation reflected back onto the receiver 4 by the stationary object 7 has reached a value at which the pulse-shaper 5 is actuated and the potential of the signal applied to the input a of the microprocessor 6 varies.

The microprocessor 6 reacts to this change of the potential at the input a due to the fact that it reduces the level of the signal, which it emits at the output d, once more by a small amount, for example by a certain percentage. Due to this the amplification factor of the amplifier 2 is likewise reduced somewhat; the capacity of the transmitter 3 decreases, so that the signal amplitude emitted by the receiver 4 to the pulse-shaper 5 is no longer sufficient to actuate the pulse-shaper 5.

A tolerance range of transmitter capacities or admissible values of the signal at the output d is programmed into a memory present in the microprocessor 6. If the value of the transmitter capacity or of the signal at the output d ascertained in the above-described initialisation process lies within this tolerance range, the initialisation can be terminated. However, if this value lies outside the range of tolerance, the initialisation process is once again repeated, possibly several times, in order to eliminate random false measurements. However, the number of repetitions is limited, for example by specifying a short time, within which repetitions are carried out. If, after this, an admissible value of the transmitter capacity or of the signal at the output d of the microprocessor 6 is not ascertained, the initialisation process is interrupted and the announcement of a fault takes place.

If the initialisation process is terminated by ascertaining an admissible value for the transmitter capacity, then the sensitivity of the circuit arrangement is as close as possible to the value, at which an (undesirable) actuation would occur due to stationary objects 7; however, this critical value is reliably not reached by returning the transmitter capacity.

The circuit arrangement and the sanitary fitting controlled thereby are now ready for normal operation:

At the times which are determined by the pulse durations emitted by the microprocessor 6 at the output c, the generator 1 emits its clock signal. The latter is amplified in the amplifier 2 by the amplification factor, which was determined previously in the above-described initialisation process and then fixed. The radiation output emitted by the transmitter 3 is correspondingly great, which as is known is not sufficient for the existing stationary object 7 to initiate the sanitary fitting. However, if another, non-stationary object 7, for example the hand of a user, now moves closer to the transmitter 3, then the intensity of the radiation striking the receiver 4 increases. The output signal of the receiver 4 actuates the pulse-shaper 5. During normal operation, the potential change caused thereby at the input a of the microprocessor 6 has the result that a signal appears at the output b of the microprocessor 6, which can be processed further for actuating the solenoid valve MV. The water begins to flow, as long as the movable object reflects sufficient light onto the receiver 4. If the movable object 7 moves out of the range of sensitivity of the circuit arrangement, then the pulse-shaper 5 drops out, since it no longer receives a signal of sufficient amplitude within the predetermined frequency band from the receiver 4. The potential at the input a of the microprocessor 6 once again reverts to its original value. The supply of current to the solenoid valve MV is terminated.

The above-described initialisation process is carried out not solely at the time of the first assembly (initial installation) of the sanitary fitting and of the circuit arrangement in situ. In order to be able to monitor aging processes or changes in the surroundings of the sanitary fitting, the initialisation process is automatically repeated at certain time intervals, for example every fourteen days.

If, in certain installations, for example in showers, no stationary object 7 is located within the immediate vicinity of the transmitter 3 and receiver 4, on which object the reflection necessary for carrying out the initialisation process may take place, then this stationary object 7 is replaced by the inner surface of the optical window, which is mounted in front of the transmitter 3 combined with the receiver 4 as one unit. A reflection (even if comparatively small) of the radiation emitted by the transmitter 3 always takes place on this inner surface. A part of this reflected radiation also passes to the receiver 4. The rise of the level, which the microprocessor 6 makes available at its output d and thus the magnitude of the amplification factor of the amplifier 2 and the capacity of the transmitter 3 reach their maximum at the latest when the radiation reflected by the optical window onto the receiver 4 is sufficient to actuate the pulse-shaper 5. If the microprocessor 6 does not ascertain a potential change at its input a, even in the case of very high capacities of the transmitter 3, then it interprets this as a system fault (for example the optical window may be damaged) and emits a corresponding alarm.

In order to ensure that for the said purpose sufficient intensity of radiation is reflected back onto the receiver 4 by the optical window, the radiation of the transmitter 3 is guided with an acute angle of incidence, thus not perpendicularly, through the optical window.

I claim:

1. Method for operating a circuit arrangement for a sanitary fitting controlled in a non-contacting manner with a transmitter, with a receiver, onto which radiation emitted by the transmitter can be reflected back by an object, and with an evaluation circuit following the receiver, which emits an output signal when the signal emitted by the receiver exceeds a certain threshold value, characterised in that upon the initial installation of the circuit arrangement, an initialisation process is automatically initiated and carried out, in the course of which the capacity of the transmitter (3) is progressively increased, until the evaluation circuit (5) responds due to radiation reflected on a stationary object (7), that thereupon the capacity of the transmitter (3) is once more reduced somewhat and thereafter there is a change to normal operation at this reduced capacity of the transmitter (3).

2. Method according to claim 1, characterised in that the value of the capacity of the transmitter (3) ascertained at the time of the initialisation process is compared with a predetermined tolerance range, within which the capacity must be located at the time of normal operation of the circuit arrangement and that if necessary the initialisation process is repeated several times, if the ascertained value of the capacity of the transmitter (3) does not lie within the tolerance range.

3. Method according to claim 1, characterised in that the initialisation process is automatically repeated within greater time intervals after the initial installation.

4. Circuit arrangement for a sanitary fitting controlled in a non-contacting manner with
   a) a transmitter, which emits radiation;
   b) a receiver, which receives the radiation from the transmitter reflected by an object;
   c) an evaluation circuit following the receiver, which emits an output signal when the signal emitted by the receiver exceeds a certain threshold value, characterised in that
   d) the transmitter (3) is supplied with power by an amplifier (2) with variable amplification, which comprises an input (b) for applying a variable control voltage;
   e) a programmable device (6) is provided, which in turn comprises:
      an input (a), to which the output signal of the evaluation circuit (5) can be supplied;
      an output (d), which is connected to the input (b) of the amplifier (2),
      the programmable device (6) being programmed so that in an initialisation process directly after the initial installation, a signal sent to the input (b) of the amplifier (2) is varied so long in the direction in which an increase of the amplification results, until the evaluation circuit (5) is initiated by radiation reflected on a stationary object (7), that then the signal of the programmable device (6) sent to the amplifier (2) is reduced slightly in the sense of a reduction of the amplification, and that then there is an automatic return of the circuit arrangement to normal operation, at this reduced amplification.

5. Circuit arrangement according to claim 4, characterised in that provided in the programmable device (6) is a memory, in which an admissible range of signals at the output (a) is memorised, as well as a comparator, which compares the value of the signal at the output (a) ascertained in the initialisation process, with the memorised, admissible range.

6. Circuit arrangement according to claim 4, characterised in that the programmable device (6) is programmed so that the initialisation process is repeated several times within a short time, if no value of the signal at the output (a) lying within the admissible range is ascertained.

7. Circuit arrangement according to claim 4, characterised in that the programmable device (6) is programmed so that the initialisation process is repeated at greater time intervals after the initial installation.

8. Circuit arrangement according to one of claim 4, characterised in that at an output (c), the programmable device (6) emits pulses of adjustable duration and sequence, during which the amplifier (2) supplies the transmitter (3).

9. Circuit arrangement according to one of claim 4, characterised in that the programmable device (6) is a microprocessor.

* * * * *